(12) United States Patent
Sugo et al.

(10) Patent No.: US 7,678,874 B2
(45) Date of Patent: *Mar. 16, 2010

(54) POLYIMIDE HAVING AN ALCOHOLIC HYDROXYL GROUP AND A PROCESS FOR THE PREPARATION THEREOF

(75) Inventors: Michihiro Sugo, Annaka (JP); Hideto Kato, Takasaki (JP); Tomoyuki Goto, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 468 days.

This patent is subject to a terminal disclaimer.

(21) Appl. No.: 11/239,238

(22) Filed: Sep. 30, 2005

(65) Prior Publication Data

US 2006/0069227 A1 Mar. 30, 2006

(30) Foreign Application Priority Data

| Sep. 30, 2004 | (JP) | ............................ | 2004-286340 |
| Oct. 6, 2004 | (JP) | ............................ | 2004-293825 |
| Sep. 28, 2005 | (JP) | ............................ | 2005-281920 |

(51) Int. Cl.
   *C08G 73/00* (2006.01)
(52) U.S. Cl. ................. 528/170; 528/310; 528/323; 528/26; 528/125; 528/128; 528/171; 528/172; 528/173; 428/411.1; 428/413; 428/457; 428/458
(58) Field of Classification Search ............... 528/310, 528/323, 26, 125, 128, 170, 171, 172, 173; 428/411.1, 413, 457, 458
See application file for complete search history.

(56) References Cited

U.S. PATENT DOCUMENTS

| 2004/0019174 A1* | 1/2004 | Ichiroku et al. | ............... 528/25 |
| 2004/0235992 A1* | 11/2004 | Okada et al. | ............... 524/115 |

FOREIGN PATENT DOCUMENTS

| EP | 0 676 456 A1 | 10/1995 |
| JP | 6-200216 A | 7/1994 |
| JP | 10-195278 A | 7/1998 |
| JP | 2001-335619 A | 12/2001 |
| WO | WO 02/097532 | * 12/2002 |

OTHER PUBLICATIONS

STIC structure search, Jul. 6, 2007.*
www.sigma-aldrich.com, 2000-2001.*

* cited by examiner

*Primary Examiner*—James Seidleck
*Assistant Examiner*—Gregory Listvoyb
(74) *Attorney, Agent, or Firm*—Birch, Stewart, Kolasch & Birch, LLP (57) ABSTRACT

This invention relates to a novel polyimide silicone having an alcoholic hydroxyl group and a process for the preparation thereof. The polyimide of the invention having a primary alcoholic hydroxyl group is represented by the following general formula (1),

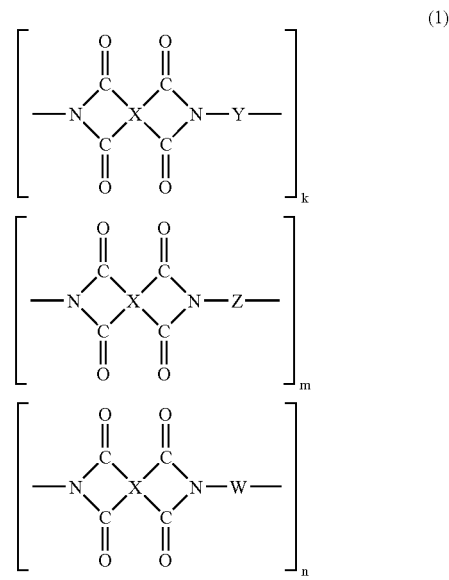

(1)

wherein

X represents a tetravalent organic group, Y represents a divalent group having at least one monovalent group selected from the group consisting of a phenolic hydroxyl group and a carboxyl group, with at least one being a divalent organic group having an alcoholic hydroxyl group, Z represents a divalent organic group, W represents a divalent organic group having an organosiloxane structure, k is a positive number, and each of m and n is equal to 0 (zero) or a positive number, with $0.1 \leq k/(k+m+n) \leq 1$, $0 \leq m/(k+m+n) \leq 0.8$, $0 \leq n/(k+m+n) \leq 0.8$.

6 Claims, 5 Drawing Sheets

POLYIMIDE HAVING AN ALCOHOLIC HYDROXYL GROUP AND A PROCESS FOR THE PREPARATION THEREOF

CROSS REFERENCES

This application claims benefits of Japanese Patent Application No. 2004-286340 filed on Sep. 30, 2004, Japanese Patent Application No. 2004-293825 filed on Oct. 6, 2004, and Japanese Patent Application No. 2005-281920 filed on Sep. 28, 2005, the contents of which are hereby incorporated by reference.

FIELD OF THE INVENTION

This invention relates to a novel polyimide having a primary hydroxyl group and a process for the preparation of the polyimide. The polyimide is excellent in heat resistance, chemical resistance, an insulating property, and flexibility and, therefore, suitable as a protective insulating film for semiconductor chips, an insulating film for multilayer printed circuit boards, a solder protecting film, and a coverlay film.

BACKGROUND OF THE INVENTION

Various kinds of polyimides having a hydroxyl group were proposed.

For instance, a polyimide having a phenolic hydroxyl group is described in Japanese Patent Application Laid-Open No. 6-200216 and Japanese Patent No. 3329677. A polyimide having an epoxy or unsaturated hydrocarbon group and a secondary alcoholic hydroxyl group is described in Japanese Patent Application Laid-open No. 2001-335619. However, a polyimide having a primary alcoholic hydroxyl group which is reactive has not been developed yet.

SUMMARY OF THE INVENTION

The present invention has been made in view of the above-mentioned situation and provides a novel polyimide having a primary alcoholic hydroxyl group and a process for the preparation of the polyimide.

The present invention provides a novel polyimide having an alcoholic hydroxyl group and represented by the following general formula (1), (1)

wherein
X represents a tetravalent organic group,
Y represents a divalent organic group represented by the general formula (2), (2)

wherein
A may be same with or different from one another and represents a divalent organic group selected from the following radicals:

each of B and C may be same with or different from one another and represents a hydrogen atom or an alkyl group having from 1 to 4 carbon atoms, each of a and b is 0 or 1, c is an integer of from 0 to 10, and $R^1$ is a monovalent group selected from the group consisting of a phenolic hydroxyl group, a carboxyl group, and an organic group having an alcoholic hydroxyl group, with at least one $R^1$ being an organic group having an alcoholic hydroxyl group, Z represents a divalent organic group, W represents a divalent organic group having an organosiloxane structure, k is a positive number, each of m and n is equal to 0 (zero) or a positive number, with $0.1 \leq k/(k+m+n) \leq 1$, $0 \leq m/(k+m+n) \leq 0.8$, $0 \leq n/(k+m+n) \leq 0.8$.

The polyimide having a primary alcoholic hydroxyl group of the present invention is excellent in adhesion to a substrate, heat resistance, and electric insulation and, therefore, a film from the polyimide is suitably used as a protecting film for electric parts, electronic parts, and semiconductor chips.

DESCRIPTION OF THE PREFERRED EMBODIMENTS

Figure 1:
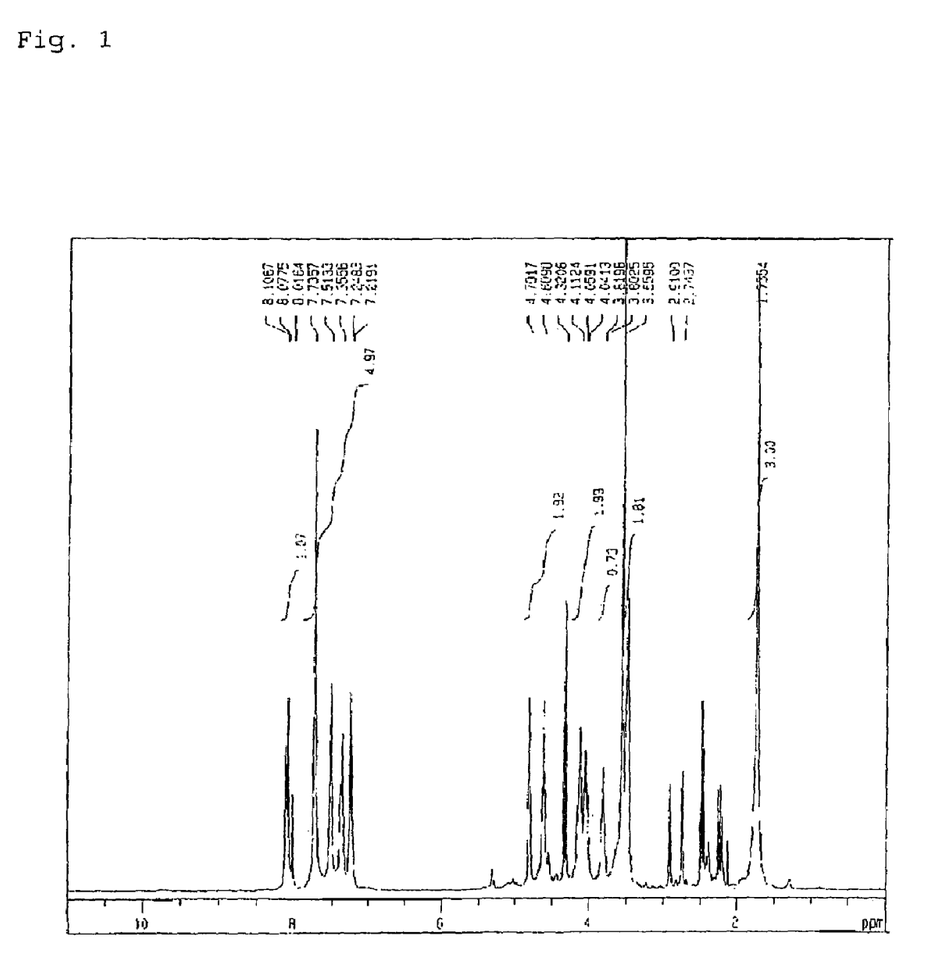
FIG. 1 is a $^1$H NMR chart of the polyimide silicone synthesized in Example 1.
Figure 2:
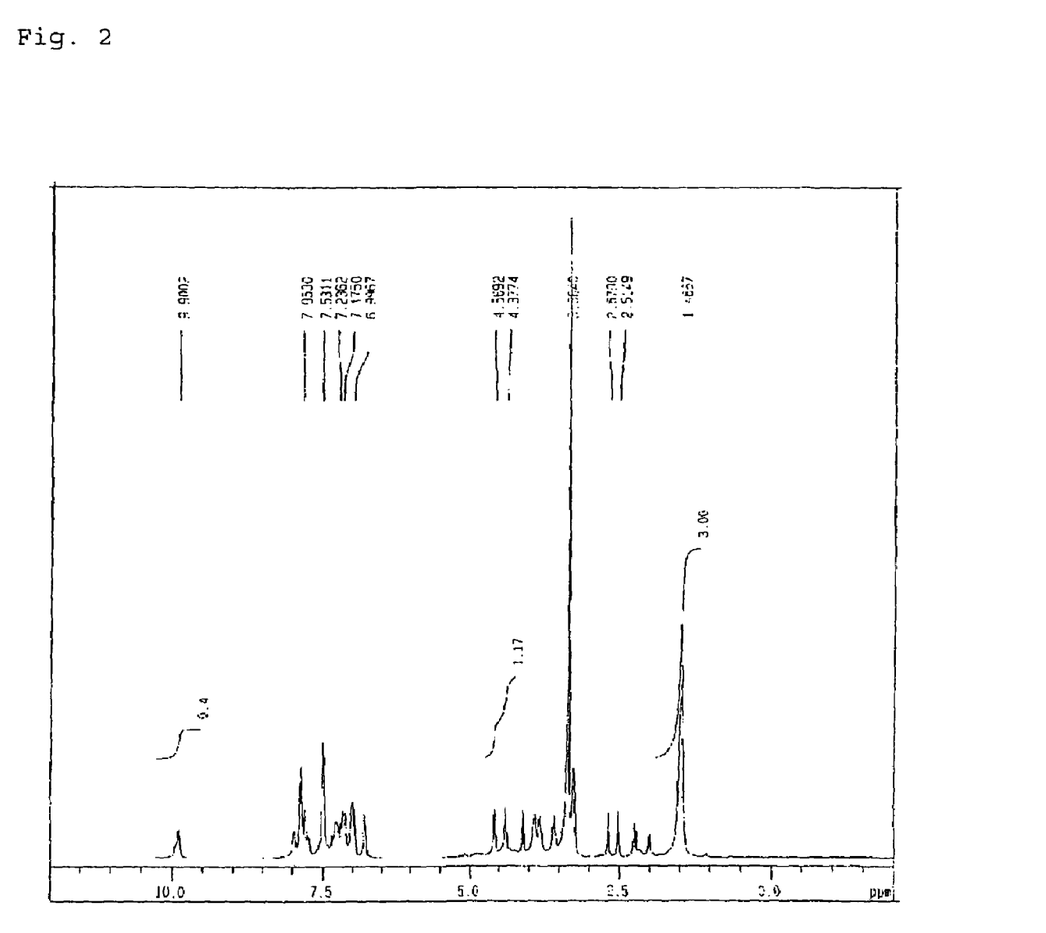
FIG. 2 is a $^1$H NMR chart of the polyimide silicone synthesized in Example 2.
Figure 3:
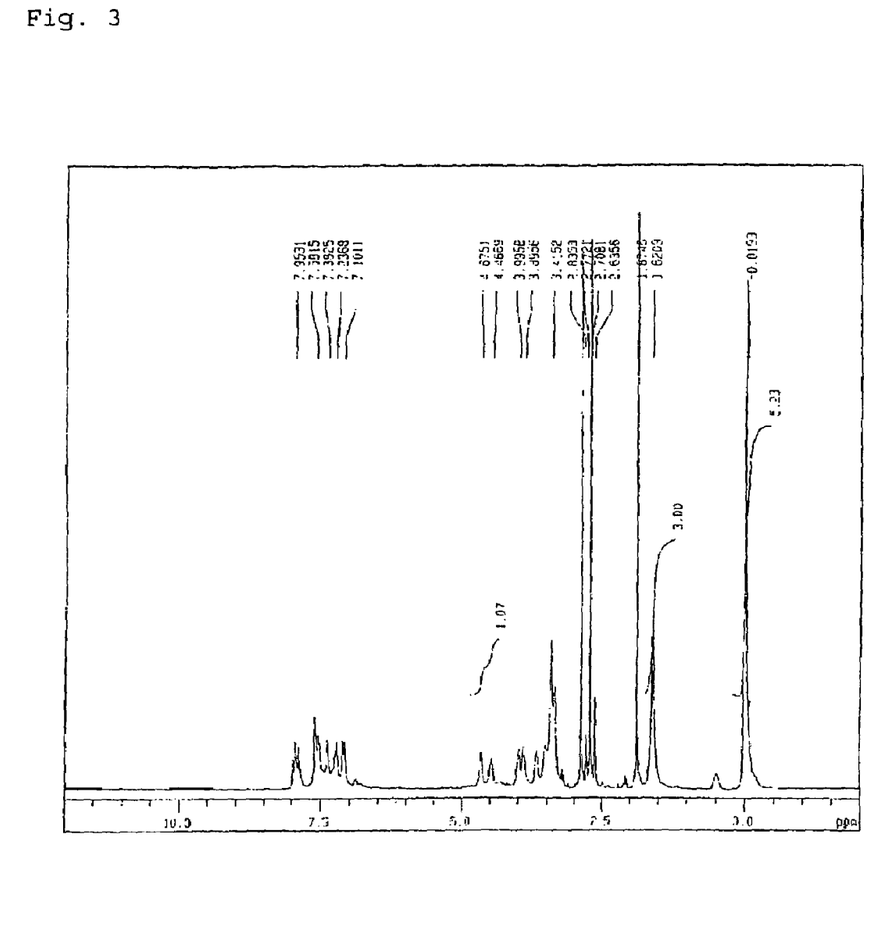
FIG. 3 is a $^1$H NMR chart of the polyimide silicone synthesized in Example 5.
Figure 4:
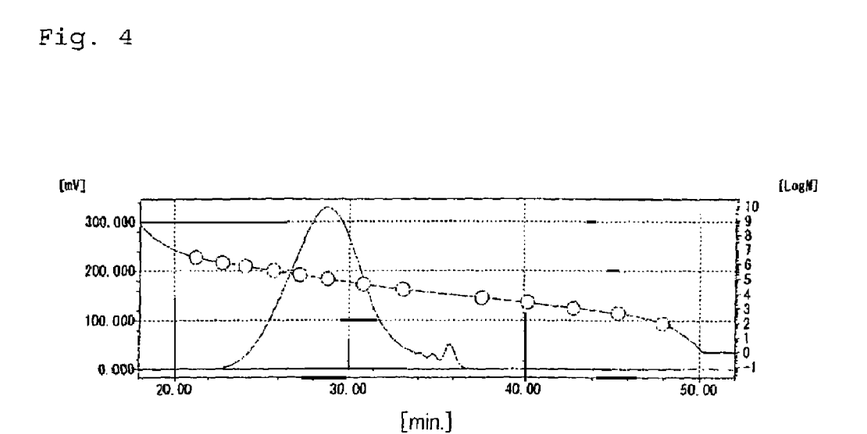
FIG. 4 is a GPC chart of the polyimide silicone synthesized in Example 1.
Figure 5:
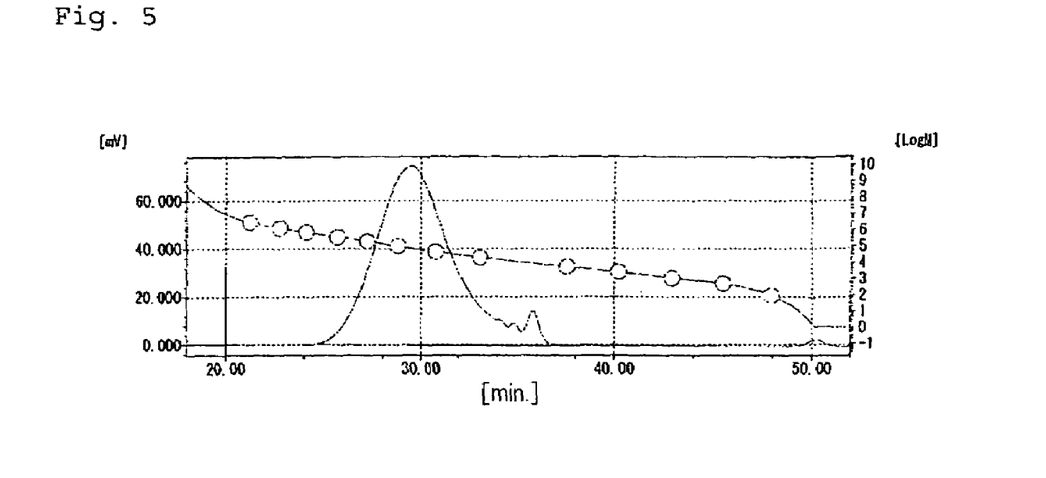
FIG. 5 is a GPC chart of the polyimide silicone synthesized in Example 2.
Figure 6:
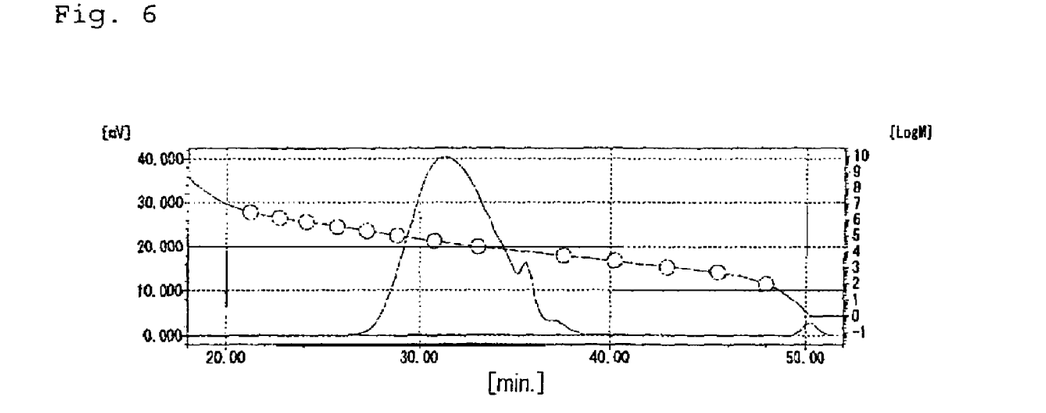
FIG. 6 is a GPC chart of the polyimide silicone synthesized in Example 3.
Figure 7:
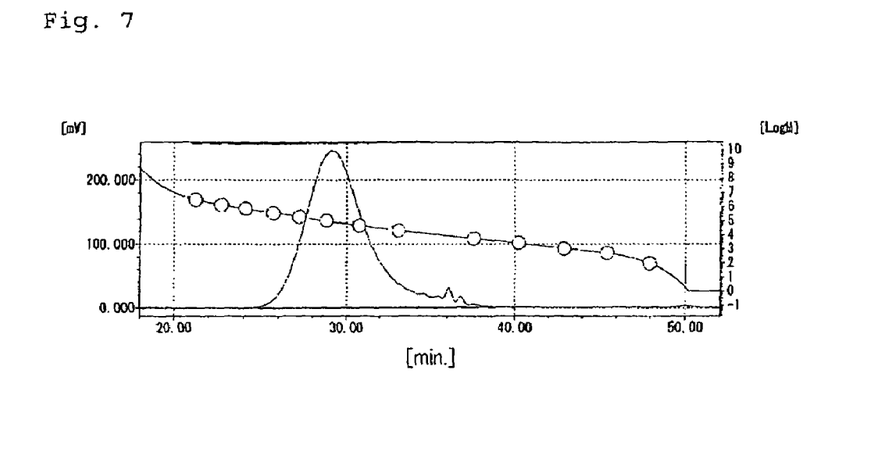
FIG. 7 is a GPC chart of the polyimide silicone synthesized in Example 4.
Figure 8:
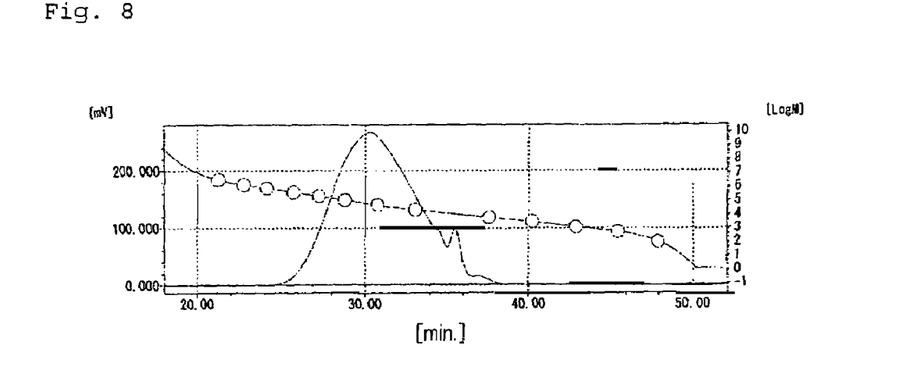
FIG. 8 is a GPC chart of the polyimide silicone synthesized in Example 5.
Figure 9:
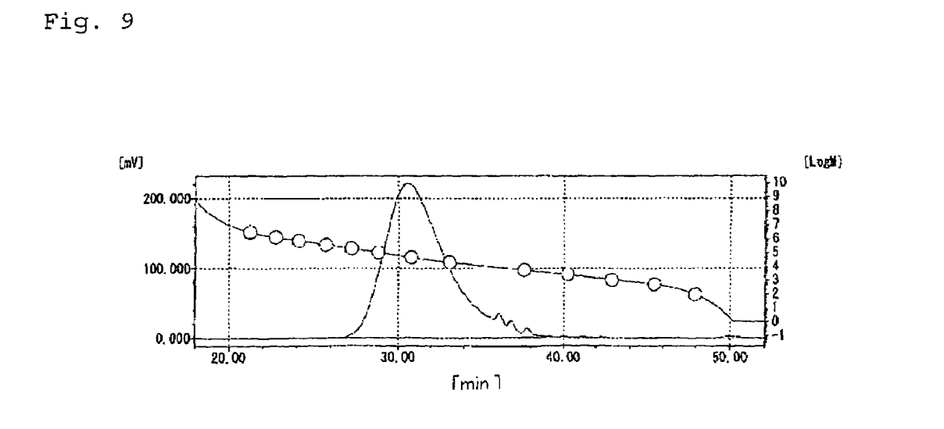
FIG. 9 is a GPC chart of the polyimide silicone synthesized in Example 6.

The present invention will be described in detail. The polyimide of the present invention has a structure represented by the following general formula (1).

(1)

In the above general formula (1), X represents a tetravalent organic group, in particular a tetravalent organic group represented by any one of the following radicals:

Y in the general formula (1) is a divalent organic group having a primary alcoholic hydroxyl group and represented by the following general formula (2).

(2)

In the above formula, A, a, b, and c are as defined above, each of B and C may be same with or different from one another and represents a hydrogen atom or an alkyl group having from 1 to 4 carbon atoms, specifically, a methyl group, an ethyl group, a propyl group, and a butyl group. A methyl group and a hydrogen atom are preferred since raw materials are easily available in these cases.

In the above general formula (2), $R^1$ represents a monovalent organic group selected from the group consisting of a phenolic hydroxyl group, a carboxyl group, and an organic group having an alcoholic hydroxyl group, with at least one $R^1$ being an organic group having a primary alcoholic hydroxyl group. Specifically, $R^1$ represents —OH, —COOH, —OCH$_2$CH(OH)CH$_2$OH, —OCH(CH$_2$OH)CH$_2$OH, —COOCH$_2$CH(OH)CH$_2$OH, or —COOCH(CH$_2$OH)CH$_2$OH.

Specific examples of Y include the following radicals:

Z in the general formula (1) is a divalent organic group represented by the following general formula (3),

(3)

wherein D may same with or different from one another and represents a divalent organic group selected from the group consisting of the following radicals, and e, f, and g are 0 or 1.
Specific examples of Z include the following radicals:

W in the general formula (1) is a divalent organic group represented by the following general formula (4), $$\text{(4)}$$

In the general formula (4), $R^3$ may be same with or different from one another and is a monovalent hydrocarbon group having from 1 to 8 carbon atoms. Specifically, mention may be made of an alkyl group, such as a methyl group, an ethyl group, a propyl group, a butyl group, a pentyl group, and a hexyl group; a cycloalkyl group, such as a cyclopentyl group and a cyclohexyl group; an aryl group, such as a phenyl group; an aralkyl group such as a benzyl group and a phenethyl group; an alkenyl group, such as a vinyl group, an allyl group, a propenyl group, an isopropenyl group, and a butenyl group; an acrylic group and a methacrylic group. Preferred are a methyl group, an ethyl group, a phenyl group, and a vinyl group, since raw materials in these cases are easily available. "h" is a positive number of from 1 to 80, preferably from 3 to 70, and more preferably from 5 to 50.

Preferably, k, m, and n in the general formula (1) are zero or positive numbers with $2 \leq k \leq 2000$, $0 \leq m \leq 2000$, and $0 \leq n \leq 2000$ and also satisfy the following: $0.1 \leq k/(k+m+n) \leq 1$; $0 \leq m/(k+m+n) \leq 0.8$; and $0 \leq n/(k+m+n) \leq 0.8$. A polyimide with $k/(k+m+n)<0.1$ is not preferred because the envisaged effect by the primary alcoholic hydroxyl group is not sufficiently realized.

A molecular weight of the polyimide represented by the general formula (1) is generally from about 2,000 to about 800,000, preferably from 5,000 to 500,000. If the molecular weight is equal to or less than the aforesaid lower limit, the strength of the resulting polyimide film is undesirably low. Meanwhile, if the molecular weight exceeds the aforesaid upper limit, the compatibility with a solvent is worse, which is undesired.

The polyimide having a primary alcoholic hydroxyl group and represented by the general formula (1) may be prepared by reacting an acid dianhydride with a diamine having at least one selected from a phenolic hydroxyl group and a carboxyl group, optionally a diamine having neither a phenolic hydroxyl group nor a carboxyl group, and also optionally a dimainosilicone, to obtain a polyamic acid, subsequently subjecting the polyamic acid to dehydration cyclization to obtain a polyimide having at least one selected from a phenolic hydroxyl group and a carboxyl group and represented by the general formula (5), (5)

wherein, X, Z, W, k, m, and n are as defined above, and Y' is a divalent organic group represented by the following general formula (6), (6)

wherein A, B, C, a, b, and c are as defined above, and $R^2$ is —OH or —COOH, and then reacting the resulting polyimide with a glycidol.

As the acid dianhydride that may be used for polymerization into a polyamic acid, mention may be made of 3,3',4,4'-diphenylsulphonetetracarboxylic dianhydride, 3,3',4,4'-biphenyltetracarboxylic dianhydride, 2,3',3,4'-biphenyltetracarboxylic dianhydride, 5-(2,5-dioxotetrahydro-3-furanyl)-3-methyl-3-cyclohexene-1,2-dicarboxyl dianhydride, 4-(2,5-dioxotetrahydrofuran-3-yl)-1,2,3,4-tetrahydronaphthalene-1,2-dicarboxylic dianhydride, 1,2,3,4-butanetetracarboxylic dianhydride, 3,3',4,4'-benzophenonetetracarboxylic dianhydride, 4,4'-hexafluoropropylidenebisphthalic dianhydride, 2,2-bis(p-trimethoxyphenyl)propane, 1,3-tetramethyldisiloxanebisphthalic dianhydride, and 4,4'-oxydiphthalic dianhydride.

As the diamine having a phenolic hydroxyl group and/or a carboxyl group, mention may be made of a diamine having a phenolic group, such as 3,3'-diamino-4,4'-dihydroxylbiphenyl, 2,2-diamino-4,4'-dihydroxybiphenyl, 2,2-bis(4-amino-3-hydroxylphenyl)propane, 2,2-bis(3-amino-4-hydroxylphenyl)propane, 9,9-bis(3-amino-4-hydroxylphenyl)fluorene, 2,2'-methylenebis[6-(4-amino-3,5-dimethylbenzyl)-4-methyl]phenol, 3,3'-diamino-4,4'-dihydroxydiphenylether, and 2,2-bis(3-amino-4-hydroxylphenyl)hexafluoropropane; 3,5-diaminobenzoic acid, 2,4-diaminobenzoic acid; 3,3'-dicarboxyl-4,4'-diaminodiphenylmethane; 4,4'-diaminobiphenyl-3,3'-dicarboxylic acid; 4,4'-diaminobiphenyl-2,2'-dicarboxylic acid; 3,3'-dicarboxyl-4,4'-diaminodiphenylether.

As the diamine having neither a phenolic hydroxyl group nor a carboxyl group, mention may be made of 4,4'-diaminobenzanilide, 4,4'-diaminodiphenylether, 3,4'-diaminodiphenylether, 4,4'-diaminodiphenylsulphone, 3,3'-dimethyl-4,4'-diaminobiphenyl, 4,4'-(p-phenylenediisopropylidene)dianiline, 4,4'-(m-phenylenediisopropylidene)dianiline, 1,3-bis(4-aminophenoxy)benzene, 1,4-bis(4-aminophenoxy)benzene, 1,3-bis(3-aminophenoxy)benzene, 2,2-bis[4-(4-aminophenoxy)phenyl]propane, 2,2-bis[4-(4-aminophenoxy)phenyl]hexafluoropropane, bis[4-(4-aminophenoxy)phenyl]sulphone, bis[4-(3-aminophenoxy)phenyl]sulphone, 4,4'-bis(4-aminophenoxy)biphenyl, and 9,9-bis(4-aminophenyl)fluorene.

In the preparation of the polyamic acid, a ratio of the diamine component to the tetracarboxylic dianhydride component may be determined to control molecular weight of the polyimide and, in general, may be from 0.95 to 1.05, preferably from 0.98 to 1.02. In order to control the molecular weight of the polyimide, it is possible to add a mono-functional acid anhydride such as phthalic anhydride or a mono-functional amine compound, such as aniline. In this case, the mono-functional compound may preferably be added in an amount equal to or less than 5 mole %, relative to the tetracarboxylic dianhydride component or the diamine component.

In order to obtain the polyimide, a solution of the polyamic acid thus obtained is heated generally to a temperature of from 80 to 200 degrees C., preferably from 140 to 180 degrees C., or a mixture of acetic anhydride and pyridine is added to a solution of the polyamic acid, and then the resulting solution is heated to a temperature of about 50 degrees C. to cause dehydration cyclization between an acid group and an amide group of the polyamic acid.

The reaction of the diamine with the acid dianhydride generally takes place in a solvent. As the solvent, any solvent that can dissolve the polyimide may be used. As specific examples of the solvent, mention may be made of ethers such as tetrahydrofuran and anisole; ketones such as cyclohexanone, 2-butanone, methylisobutylketone, 2-heptanone, 2-octanone, and acetophenone; esters such as butyl acetate, methyl benzoate, and gamma-butyrolactone; cellosolve acetates, such as butylcellosolve acetate, and propyleneglycol monomethylether acetate; amides, such as N,N-dimethylformamide, N,N-dimethylacetamide, and N-methyl-2-pyrrolidone; and aromatic hydrocarbons, such as toluene and xylene. Preferred are ketons, esters, and cellosolves, particularly gamma-butyrolactone, propyleneglycol monomethylether acetate, N,N-dimethylacetamide, and N-methyl-2-pyrrolidone. These solvents may be used alone or in combination of two or more of the solvents. Usually, the concentration of the polyimide is controlled in a range of from 10 to 40 weight %, taking account of a yield per batch and a solution viscosity.

To the solution of the polyimide thus-obtained having a phenolic hydroxyl group and/or a carboxyl group and represented by the above-mentioned general formula (5), a proper amount of glycidol is added, and heated to obtain the envisaged polyimide having an alcoholic hydroxyl group and represented by the above-mentioned general formula (1). The amount of glycidol to be added has to be determined depending on an amount of an alcoholic hydroxyl group to be introduced and is preferably from 0.3 to 3 molar equivalents, relative to the phenolic hydroxyl group or the carboxyl group. The preferred reaction temperature is from 40 degrees C. to 180 degrees C., preferably from 60 degrees C. to 130 degrees C. The reaction time varies from several minutes to 12 hours. A catalyst such as triethylamine may be added in order to accelerate the reaction.

The polyimide thus obtained has alcoholic hydroxyl groups which are mostly primary and has a novel property in respect of reactivity. By utilizing the reactive primary alcoholic hydroxyl group, the novel polyimide can be processed into a protective insulating film for semiconductor chips, an insulating film for multilayer printed circuit boards, a solder protecting film, and a coverlay film, which have excellent heat resistance, chemical resistance, insulating property, and flexibility.

The present invention will be elucidated with reference to the Examples, but shall not be limited thereto.

EXAMPLES

Example 1

In a flask equipped with a stirrer, a thermometer, and nitrogen purge equipment, were added 31.0 g (0.1 mole) of 4,4'-oxydiphthalic dianhydride and 150 g of N-methyl-2-pyrrolidone. Subsequently, to the above-mentioned flask was added dropwise 25.8 g (0.1 mole) of 2,2'-bis (4-amino-3-hydroxylphenyl) propane dissolved in 100 g of N-methyl-2-pyrrolidone, while controlling the temperature of the reaction system at or below 50 degrees C. After the completion of the addition, the reaction mixture was further stirred at room temperature for 10 hours. Then, a reflux condenser provided with a water receptor was attached to the flask and 70 g of xylene was added. The temperature was raised to 150 degrees C., and this temperature was maintained for 6 hours to obtain a brown solution.

The brown solution thus obtained was cooled to room temperature, 25 degrees C., and then subjected to IR spectroscopy. The infrared absorption spectrum did not show absorption based on the polyamic acid, but instead showed absorption at 1780 cm$^{-1}$ and 1720 cm$^{-1}$ based on the imide group and absorption at approximately 3400 cm$^{-1}$ based on the phenol group. The spectrum indicates a polymer having repeating units represented by the following formula:

The number average molecular weight was 54,700, reduced to polystyrene, as determined by gel permeation chromatography (GPC).

Then to a flask, were added 200 g of the thus-obtained polymer solution having a resin solid content of 17%, and 11.4 g of glycidol. The reaction mixture was heated at 120 degrees C. for 6 hours. Then, the reaction mixture was cooled to room temperature and poured into 1 litter of methanol. The resulting precipitate was filtered and then dried to obtain the envisaged polyimide. As a result of $^1$H NMR analysis on this polymer, it was found that the peak at 10 ppm based on the phenolic hydroxyl group disappeared and, instead, peaks based on a primary alcohol and a secondary alcohol appeared at 4.6 ppm and 4.8 ppm, which indicates that a polymer having repeating units represented by the following formula was formed. The number average molecular weight of this polymer was 59, 200, as determined by gel permeation chromatography (GPC).

Example 2

In a flask equipped with a stirrer, a thermometer, and nitrogen purge equipment, were added 54.3 g (0.175 mole) of 4,4'-oxydiphthalic dianhydride, 33.3 g (0.075 mole) of 4,4'-hexafluoropropylidenebisphthalic dianhydride, and 400 g of N-methyl-2-pyrrolidone. Subsequently, to the above-mentioned flask was added dropwise 64.5 g (0.25 mole) of 2,2'bis (4-amino-3-hydroxylphenyl) propane dissolved in 200 g of N-methyl-2-pyrrolidone, while controlling the temperature of the reaction system at or below 50 degrees C. After the completion of the addition, the reaction mixture was further stirred at room temperature for 10 hours. Then, a reflux condenser provided with a water receptor was attached to the flask and 150 g of toluene was added. The temperature was raised to 150 degrees C., and this temperature was maintained for 6 hours to obtain a brown solution.

The brown solution thus obtained was cooled to room temperature, 25 degrees C., to obtain a solution of the polyimide having a phenolic hydroxyl group, with a resin solid content being 20.3%. Then to the flask, were added 300 g of the thus-obtained polyimide solution and 10.4 g of glycidol. The reaction mixture was heated at 120 degrees C. for 3 hours. Then, the reaction mixture was cooled to room temperature and poured into 1 liter of methanol. The resulting precipitate was filtered and then dried to obtain the envisaged polyimide having a primary alcoholic hydroxyl group. As a result of $^1$H NMR analysis on this polymer, it was found that the polymer had an average structure represented by the following formula. The number average molecular weight of this polymer was 82,500, as determined by gel permeation chromatography (GPC).

tioned flask was added dropwise a solution of 25.6 g (0.07 mole) of 2,2-bis (3-amino-4-hydroxylphenyl) hexafluoropropane and 12.3 g (0.03 mole) of 2,2-[bis (4-(4-aminophenoxy) phenyl)] propane dissolved in 120 g of gamma-butyrolactone, while controlling the temperature of the reaction system at or below 50 degrees C. After the completion of the addition, the reaction mixture was further stirred at room temperature for 10 hours. Then, a reflux condenser provided with a water receptor was attached to the flask and 100 g of toluene was added. The temperature was raised to 150 degrees C., and this temperature was maintained for 6 hours to obtain a brown solution.

Example 3

In a flask equipped with a stirrer, a thermometer, and nitrogen purge equipment, were added 44.4 g (0.1 mole) of 4,4'-hexafluoropropylidenebisphthalic dianhydride, and 180 g of gamma-butyrolactone. Subsequently, to the above-mentioned The brown solution thus obtained was cooled to room temperature, 25 degrees C., to obtain a solution of the polyimide having a phenolic hydroxyl group, with a resin solid content being 21%. Then to the flask, were added 200 g of the thus-obtained polyimide solution and 6.7 g of glycidol. The reaction mixture was heated at 120 degrees C. for 6 hours.

Then, the reaction mixture was cooled to room temperature and poured into 1 liter of methanol. The resulting precipitate was filtered and then dried to obtain the envisaged polyimide. As a result of $^1$H NMR analysis on this polymer, it was found that the polymer had a structure represented by the following formula. The number average molecular weight of this polymer was 36,500, as determined by gel permeation chromatography (GPC).

hours. Then, a reflux condenser provided with a water receptor was attached to the flask and 180 g of toluene was added. The temperature was raised to 150 degrees C., and this temperature was maintained for 6 hours to obtain a brown solution.

The brown solution thus obtained was cooled to room temperature, 25 degrees C., to obtain a solution of the polyimide having a phenolic hydroxyl group, with a resin solid content being 20%. Then to the flask, were added 300 g of the thus-obtained polymer solution and 6.6 g of glycidol. The reaction mixture was heated at 100 degrees C. for 5 hours. Then, the reaction mixture was cooled to room temperature and poured into 1 liter of methanol. The resulting precipitate was filtered and then dried to obtain the envisaged polyimide. As a result of $^1$H NMR analysis on this polymer, it was found that the polymer has a stucture represented by the following formula. The number average molecular weight of this polymer was 84,000, as determined by gel permeation chromatography (GPC).

Example 4

In a flask equipped with a stirrer, a thermometer, and nitrogen purge equipment, were added 89.5 g (0.25 mole) of 3,3',4,4'-diphenylsulfonetetracarboxylic dianhydride, and 500 g of N,N-dimethylacetamide. Subsequently, to the above-mentioned flask was added dropwise a solution of 35.8 g (0.125 mole) of 3,3'-dicarboxyl-4,4'-diaminodiphenylmethane and 43.5 g (0.125 mole) of 9,9-bis(4-aminophenyl)fluorene dissolved in 200 g of N,N-dimethylacetamide, while controlling the temperature of the reaction system at or below 50 degrees C. After the completion of the addition, the reaction mixture was further stirred at room temperature for 10

-continued

Example 5

In a flask equipped with a stirrer, a thermometer, and nitrogen purge equipment, were added 77.5 g (0.25 mole) of 4,4'-oxydiphthalic dianhydride and 500 g of N,N-dimethylacetamide. Subsequently, to the above-mentioned flask was added dropwise a solution of 51.6 g (0.2 mole) of 2,2-bis(4-amino-3-hydroxylphenyl)propane and 42.0 g (0.05 mole) of diaminosiloxane with an averaged value of h in the general formula (4) being 9, dissolved in 200 g of N,N-dimethylacetamide, while controlling the temperature of the reaction system at or below 50 degrees C. After the completion of the addition, the reaction mixture was further stirred at room temperature for 10 hours. Then, a reflux condenser provided with a water receptor was attached to the flask and 150 g of toluene was added. The temperature was raised to 150 degrees C., and this temperature was maintained for 6 hours to obtain a brown solution.

The brown solution thus obtained was cooled to room temperature, 25 degrees C., to obtain a solution of the polyimide having a phenolic hydroxyl group, with a resin solid content being 20.5%. Then to the flask, were added 300 g of the thus-obtained polymer solution and 13.3 g of glycidol. The reaction mixture was heated at 120 degrees C. for 5 hours. Then, the reaction mixture was cooled to room temperature and poured into 1 litter of methanol. The resulting precipitate was filtered and then dried to obtain the envisaged polyimide. As a result of $^1$H NMR analysis on this polymer, it was found that the polymer has a structure represented by the following formula. The number average molecular weight of this polymer was 63,200, as determined by gel permeation chromatography (GPC).

Example 6

In a flask equipped with a stirrer, a thermometer, and nitrogen purge equipment, were added 111 g (0.25 mole) of 4,4'-hexafluoropropylidenebisphthalic dianhydride and 600 g of N,N-dimethylacetamide. Subsequently, to the above-mentioned flask was added dropwise a solution of 64.1 g (0.175 mole) of 2,2-bis (3-amino-4-hydroxylphenyl) hexafluoropropane, 14.6 g (0.05 mole) of 1,3-bis(3-aminophenoxy)benzene and 21.0 g (0.025 mole) of diaminosiloxane, with an averaged value of h in the general formula (4) being 9, dissolved in 250 g of N,N-dimethylacetamide, while controlling the temperature of the reaction system at or below 50 degrees C. After the completion of the addition, the reaction mixture was further stirred at room temperature for 10 hours. Then, a reflux condenser provided with a water receptor was attached to the flask and 100 g of toluene was added. The temperature was raised to 150 degrees C., and this temperature was maintained for 6 hours to obtain a brownish yellow solution.

The brownish yellow solution thus obtained was cooled to room temperature, 25 degrees C., to obtain a solution of the polyimide having a phenolic hydroxyl group, with a resin solid content being 20%. Then to the flask, were added 300 g of the thus-obtained polymer solution and 9.1 g of glycidol. The reaction mixture was heated at 120 degrees C. for 6 hours. Then, the reaction mixture was cooled to room temperature and poured into 1 litter of methanol. The resulting precipitate was filtered and then dried to obtain the envisaged polyimide. As a result of $^1$H NMR analysis on this polymer, it was found that the polymer has a structure represented by the following formula. The number average molecular weight of this polymer was 42,700, as determined by gel permeation chromatography (GPC).

-continued

The invention claimed is:

1. A polyimide having a primary alcoholic hydroxyl group and represented by the following general formula (1), wherein

X represents a tetravalent organic group,

Y represents a divalent organic group represented by the general formula (2), wherein A may be same with or different from one another and represents a divalent organic group selected from the following radicals:

each of B and C may be same with or different from one another and represents a hydrogen atom or an alkyl group having from 1 to 4 carbon atoms, each of a and b is 0 or 1, c is an integer of from 0 to 10, and $R^1$ may be the same with or different from one another and is a monovalent group selected from the group consisting of a phenolic hydroxyl group, a carboxyl group, —$OCH_2CH(OH)CH_2OH$, —$OCH(CH_2OH)CH_2OH$, —$COOCH_2CH(OH)CH_2OH$, and —$COOCH(CH_2OH)CH_2OH$, with at least one $R^1$ being a monovalent group selected from the group consisting of —$OCH_2CH(OH)CH_2OH$, —$OCH(CH_2OH)CH_2OH$, —$COOCH_2CH(OH)CH_2OH$, and —$COOCH(CH_2OH)CH_2OH$, Z represents a divalent organic group, W represents a divalent organic group having an organosiloxane structure, k is a positive number, and each of m and n is equal to 0 (zero) or a positive number, with

$0.1 \leq k/(k+m+n) \leq 1$,

$0 \leq m/(k+m+n) \leq 0.8$, $0 \leq n/(k+m+n) \leq 0.8$, wherein said polyimide having a monovalent group selected from the group consisting of —$OCH_2CH(OH)CH_2OH$, —$OCH(CH_2OH)CH_2OH$, —$COOCH_2CH(OH)CH_2OH$, and —$COOCH(CH_2OH)CH_2OH$ is derived by reacting a polyimide having a phenolic hydroxyl group or a carboxyl group with glycidol in a mole ratio of 0.3 to 3 of the glycidol relative to the phenolic hydroxyl group-containing polyimide or carboxyl group-containing polyimide.

2. The polyimide having an alcoholic hydroxyl group according to claim 1, wherein X in said general formula (1) is a tetravalent organic group represented by any one of the following formulas,

3. The polyimide comprising an alcoholic hydroxyl group according to claim 1, wherein Z in said general formula (1) is a divalent organic group represented by the following general formula (3), (3)

wherein D may be same with or different and is a divalent organic group selected from the following radicals:

and each of e, f, and g is 0 or 1.

4. The polyimide comprising an alcoholic hydroxyl group according to claim 1, wherein W in said general formula (1) is a divalent organic group represented by the following general formula (4), (4)

wherein $R^3$ may be same with or different and is a monovalent hydrocarbon group having from 1 to 8 carbon atoms and h is a positive number of from 1 to 80.

5. The siloxane-modified polyimide comprising an alcoholic hydroxyl group according to claim 1, wherein $3 \leq n \leq 400$.

6. A process for the preparation of a polyimide having an alcoholic hydroxyl group represented by the general formula (1) as defined in claim 1, wherein an acid dianhydride is reacted with a diamine having at least one functional group selected from a phenolic hydroxyl group and a carboxyl group, optionally a diamine having neither a phenolic hydroxyl group nor a carboxyl group, and also optionally a diaminosilicone, to obtain a polyamic acid, subsequently the resulting polyamic acid is subjected to dehydration cyclization to obtain a polyimide having at least one functional group selected from a phenolic hydroxyl group and a carboxyl group and represented by the general formula (5), (5)

wherein, X, Z, W, k, m, and n are as defined in claim 1, and Y' is a divalent organic group represented by the general formula (6), (6)

wherein A, B, C, a, b, and c are as defined in claim 1, and $R^2$ is —OH or —COOH, and then the polyimide is reacted, at a temperature of from 40° C. to 180° C., with a glycidol in a mole ratio of 0.3 to 3 of the glycidol relative to the phenolic hydroxyl group and the carboxyl group.

\* \* \* \* \*